US006450755B1

United States Patent
Cameron et al.

(10) Patent No.: US 6,450,755 B1
(45) Date of Patent: Sep. 17, 2002

(54) DUAL ARM SUBSTRATE HANDLING ROBOT WITH A BATCH LOADER

(75) Inventors: James A. Cameron, Los Altos; Steven G. Reyling, Mountain View, both of CA (US)

(73) Assignee: Equipe Technologies, Mountain View, CA (US)

(*) Notice: Subject to any disclaimer, the term of this patent is extended or adjusted under 35 U.S.C. 154(b) by 0 days.

(21) Appl. No.: 09/113,599

(22) Filed: Jul. 10, 1998

(51) Int. Cl.[7] ............................................. B65G 49/07
(52) U.S. Cl. ........................... 414/416.08; 414/222.09; 414/226.01; 414/937; 414/941
(58) Field of Search ........................... 414/217, 222.07, 414/222.09, 222.12, 222.13, 225.01, 226.01, 416, 744.3, 744.5, 744.7, 937, 941, 416.03, 416.08; 294/2, 86.4, 902, 907

(56) References Cited

U.S. PATENT DOCUMENTS

| | | | | |
|---|---|---|---|---|
| 4,451,197 A | * | 5/1984 | Lange ..................... | 294/907 X |
| 4,603,897 A | * | 8/1986 | Foulke et al. ........... | 294/907 X |
| 5,112,641 A | * | 5/1992 | Harada et al. .......... | 414/941 X |
| 5,135,349 A | * | 8/1992 | Lorenz et al. ........ | 414/744.3 X |
| 5,180,276 A | * | 1/1993 | Hendrickson ............. | 901/15 X |
| 5,183,370 A | * | 2/1993 | Cruz ....................... | 414/937 X |
| 5,280,983 A | * | 1/1994 | Maydan et al. ......... | 414/217 X |
| 5,297,910 A | * | 3/1994 | Yoshioka et al. ...... | 414/226.01 |
| 5,324,087 A | * | 6/1994 | Shimose et al. ........ | 294/907 X |
| 5,364,222 A | * | 11/1994 | Akimoto et al. .... | 414/225.01 X |
| 5,564,889 A | * | 10/1996 | Araki ................. | 414/225.01 X |
| 5,584,647 A | * | 12/1996 | Uehara et al. ...... | 414/226.01 X |
| 5,655,871 A | * | 8/1997 | Ishii et al. ................... | 414/416 |
| 5,660,517 A | * | 8/1997 | Thompson et al. ......... | 414/217 |
| 5,664,254 A | * | 9/1997 | Ohkura et al. ...... | 414/222.13 X |
| 5,697,748 A | * | 12/1997 | Somekh et al. ..... | 414/222.13 X |
| 5,700,127 A | * | 12/1997 | Harada et al. ...... | 414/222.13 X |
| 5,915,957 A | * | 6/1999 | Tanigawa et al. ....... | 414/937 X |
| 5,950,495 A | * | 9/1999 | Ogawa et al. ....... | 414/744.5 X |
| 6,037,733 A | * | 3/2000 | Genov et al. ............. | 414/744.3 |
| 6,048,162 A | * | 4/2000 | Moslehi ....................... | 414/217 |
| 6,057,662 A | * | 5/2000 | McAndrew et al. . | 414/744.5 X |
| 6,099,238 A | * | 8/2000 | Tsubota .................... | 414/744.5 |
| 6,132,165 A | * | 10/2000 | Carducci .................. | 414/744.5 |
| 6,155,768 A | * | 12/2000 | Bacchi et al. ............... | 414/416 |
| 6,158,941 A | * | 12/2000 | Muka et al. ........... | 414/222.12 |
| 6,315,512 B1 | * | 11/2001 | Tabrizi et al. ......... | 414/222.01 |

FOREIGN PATENT DOCUMENTS

| | | | | |
|---|---|---|---|---|
| DE | 4238834 | * | 5/1993 | .................. 414/941 |
| FR | 2664525 | * | 1/1992 | .................. 414/941 |
| JP | 2209331 | * | 8/1990 | .................. 414/941 |
| JP | 4026138 | * | 1/1992 | .................. 414/937 |
| JP | 4061146 | * | 2/1992 | .................. 414/937 |
| JP | 6127621 | * | 5/1994 | .................. 414/941 |
| WO | 92/05920 | * | 4/1992 | .............. 414/744.5 |

* cited by examiner

Primary Examiner—James W. Keenan
(74) Attorney, Agent, or Firm—Weingarten, Schurgin, Gagnebin & Lebovici LLP

(57) ABSTRACT

A substrate handling robot includes an arm drive mechanism. A first arm is connected to the arm drive mechanism. A multiple substrate batch loader is connected to the first arm. A second arm is also connected to the arm drive mechanism. A single plane end effector is connected to the second arm. The multiple substrate batch loader produces a vacuum signal indicative of how many substrates are held by the multiple substrate batch loader. A vacuum signal interpreter alters the movement of the first arm in response to the substrate load number. An object sensor is connected to the second arm. The object sensor assesses the number of substrates in a cassette adjacent to the multiple substrate batch loader. A substrate loading sequence controller controls the first arm and the second arm in response to the number of substrates in the cassette, such that the second arm removes substrates from the cassette in such a manner as to facilitate complete loading of the multiple substrate batch loader.

9 Claims, 6 Drawing Sheets

DUAL ARM SUBSTRATE HANDLING ROBOT WITH A BATCH LOADER

BRIEF DESCRIPTION OF THE INVENTION

This invention relates generally to automated systems for transporting materials. More particularly, this invention relates to a dual arm substrate handling robot with a batch loader.

BACKGROUND OF THE INVENTION

Robots are used in a variety of industrial processes. For example, robots are used to handle substrates in the electronics industry. The term substrate includes such devices as semiconductor wafers, liquid crystal displays, flat panel displays, disk drives, and the like. Substrates are commonly stored in cassettes. In the case of a semiconductor wafer, a cassette of wafers is delivered to a work area. A robotic arm is used to take a single wafer from the cassette and deliver it to a pre-aligner. Once the wafer is pre-aligned, the robotic arm delivers the wafer to a testing apparatus. When testing is completed, the wafer is returned to the original cassette or a different cassette by the robotic arm. While existing robotic arms are acceptable for individual manipulation of substrates in a cassette, they are relatively inefficient for rapidly dispatching a set of substrates from one cassette to another or performing other types of bulk transfer operations.

Thus, it would be highly desirable to provide an improved technique for robotic-based bulk transfers of substrates. Ideally, the bulk transfer technique would be capable of transferring various numerical combinations of substrates to optimize transfer operations. The bulk transfer technique would preferably have a low cost mechanism for determining the number of substrates being transferred at any given time and would adjust the speed of its motion accordingly. Such a device should use known materials and techniques and otherwise be compatible with existing robotic processes.

SUMMARY OF THE INVENTION

The apparatus of the invention includes a substrate handling robot with an arm drive mechanism. A first arm is connected to the arm drive mechanism. A multiple substrate batch loader is connected to the first arm. A second arm is also connected to the arm drive mechanism. A single plane end effector is connected to the second arm. The multiple substrate batch loader senses a vacuum signal indicative of how many substrates are held by the multiple substrate batch loader. A vacuum signal interpreter selectively alters the movement of the first arm in response to the substrate load number. An object sensor is connected to the second arm. The object sensor assesses the number of substrates in a cassette adjacent to the multiple substrate batch loader. A substrate loading sequence controller controls the first arm and the second arm in response to the number of substrates in the cassette, such that the second arm removes substrates from the cassette in such a manner as to facilitate complete loading of the multiple substrate batch loader.

The method of the invention includes the step of removing a first substrate from a storage site with a single paddle. A set of substrates are removed from the storage site with a multiple substrate batch loader. A vacuum signal indicative of how many substrates are held by the multiple substrate batch loader is obtained. The motion of the multiple substrate batch loader is altered when the vacuum signal indicates that the multiple substrate batch loader is not fully loaded. The method may also include the step of assessing the number of substrates in the storage site. Individual substrates may be removed from the storage site to facilitate complete loading of the multiple substrate batch loader.

The invention provides an improved technique for robotic-based bulk transfers of substrates. The bulk transfer technique of the invention allows for the transfer of various numerical combinations of substrates to optimize transfer operations. The vacuum sensor associated with the multiple substrate batch loader facilitates a low cost assessment of the number of substrates being transferred at any given time. Based upon this information, the motion of the robot may be altered. Advantageously, the invention utilizes known materials and techniques and is otherwise compatible with existing processes.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
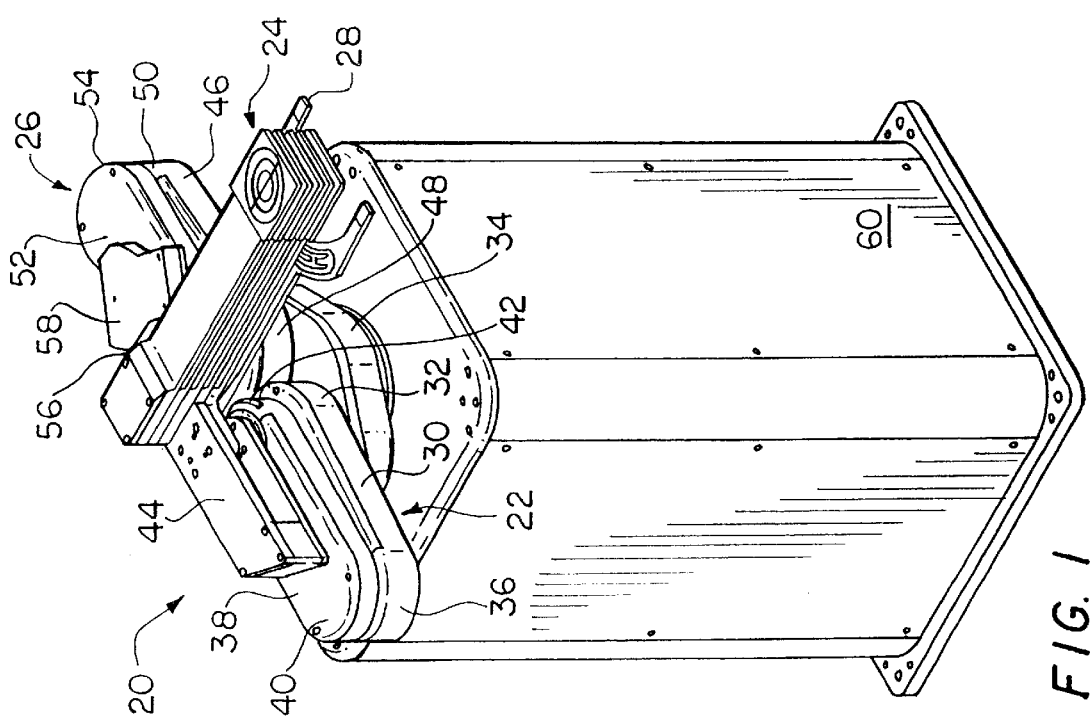
FIG. 1 is a perspective view of a dual arm batch loading robot in accordance with an embodiment of the invention.

FIG. 1 is a perspective view of a dual arm batch loading robot 20 in accordance with an embodiment of the invention. The robot 20 includes a first arm 22, which supports a multiple substrate batch loader 24. The robot also includes a second arm 26, which supports a single plane end effector 28.

The first arm 22 includes a base arm 30 with a proximal end 32 connected to an arm drive mechanism 34. The base arm 30 also includes a distal end 36. The first arm also includes a forearm 38. The proximal end 40 of the forearm 38 is connected to the distal end 36 of the base arm 30. The distal end 42 of the forearm 38 supports a batch loader support mechanism 44.

The second arm 26 includes a base arm 46 with a proximal end 48 and a distal end 50. A forearm 52 has a proximal end 54 connected to the distal end 50 of the base arm 46. An object sensor 58 is connected to the distal end 56 of the forearm 52. FIG. 1 also illustrates a housing 60, which encloses a motor and other components.

Those skilled in the art will recognize a number of benefits associated with the apparatus of FIG. 1. The multiple substrate batch loader 24 allows a set of substrates to be transported, thereby increasing processing efficiency. The single plane end effector 28 allows the robot 20 to perform traditional substrate handling operations. Other advantages and benefits of the invention are highlighted with the following discussion.

Figure 2:
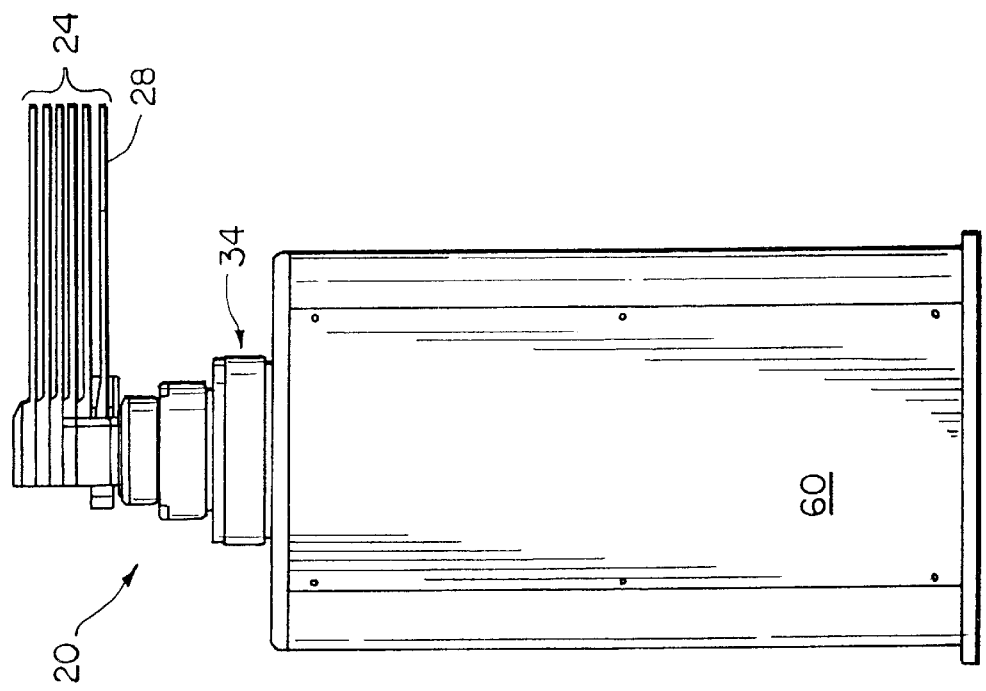
FIG. 2 is a side view of the apparatus of FIG. 1.

FIG. 2 is a side view of the robot 20. The figure illustrates the housing 60, the arm drive mechanism 34, the single plane end effector 28, and the multiple substrate batch loader 24.

Figure 3:
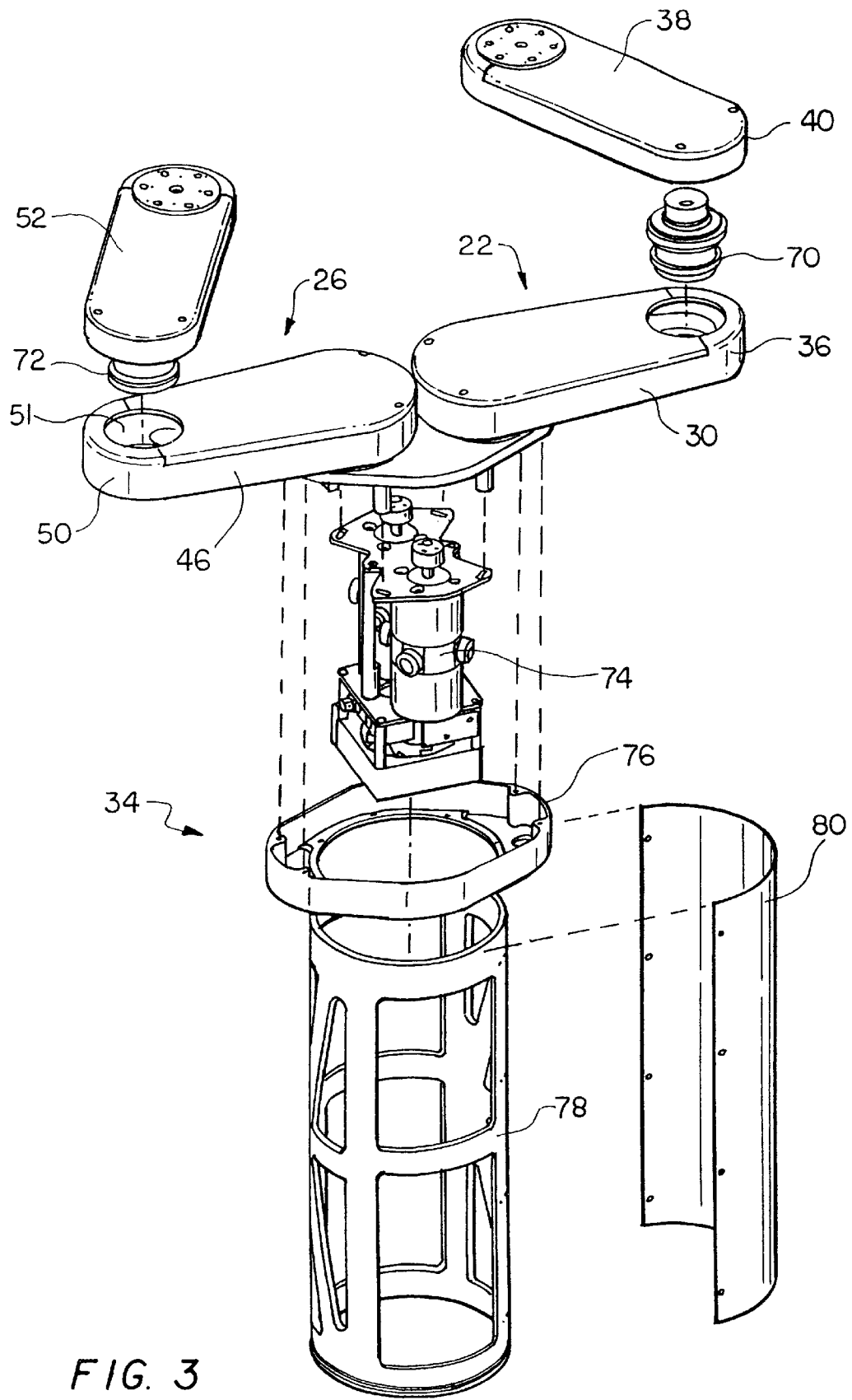
FIG. 3 is an exploded view of the dual arm structure of the apparatus of FIG. 1.

FIG. 3 is an exploded rear view of the first arm 22 and second arm 26. The figure illustrates the first arm 22 and its base arm 30, the distal end 36 of which receives a pivot mechanism 70. The proximal end 40 of the forearm 38 is also attached to the pivot mechanism 70. Similarly, the distal end 50 of the second arm 26 has an aperture 51 to receive a pivot mechanism 72 associated with forearm 52.

FIG. 3 also illustrates a portion of the arm drive mechanism 34. The arm drive mechanism 34 includes a dual shaft drive mechanism 74, which is used to provide motive force for the arms 22 and 26. A drive shaft housing 76 encloses the dual shaft drive mechanism 74. The drive shaft housing 76 rests on top of a motor housing frame 78. A motor (not shown) is positioned within the motor housing frame 78. A motor housing exterior 80 encloses the motor housing frame 78.

Figure 4A:
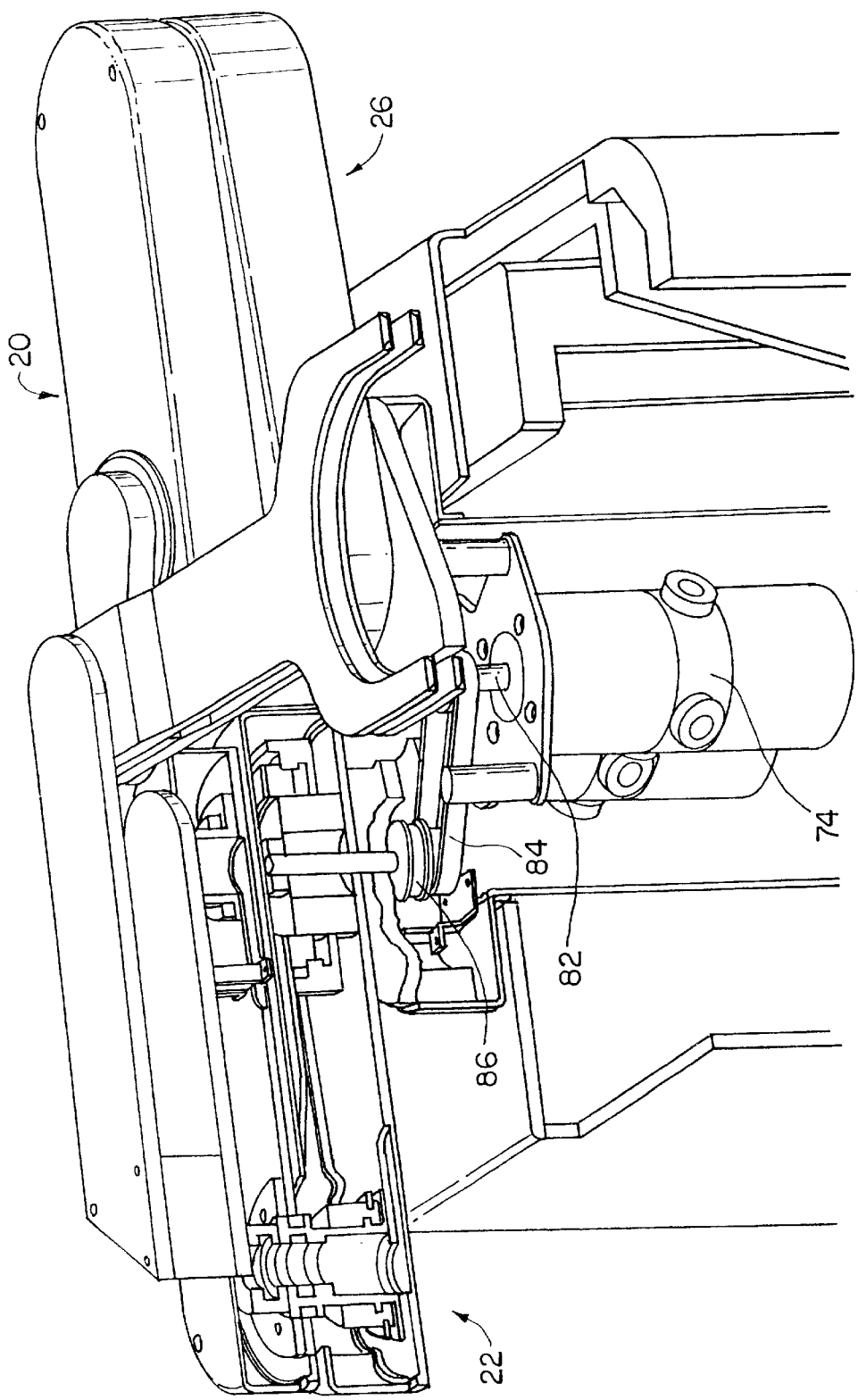
FIGS. 4A and 4B provide cross sectional views of a portion of the apparatus of FIG. 1.

FIG. 4A is a cross sectional view of a portion of the robot 20. In particular, the figure illustrates the first arm 22 and a portion of housing 60 in cross-section. The figure illustrates the dual shaft drive mechanism 74 with a first shaft 82. The shaft 82 is connected to a belt 84, which is linked to a pulley 86. A similar arrangement is used in connection with the second arm 26. The particular internal arm drive mechanism used in connection with the invention is immaterial, since any number of configurations may be used in accordance with the invention. The invention is not directed toward robotic arm movements, but to the use of a multiple substrate batch loader 24, a single plane end effector 28, and the associated utilization of these devices, as further discussed below.

Figure 4B:
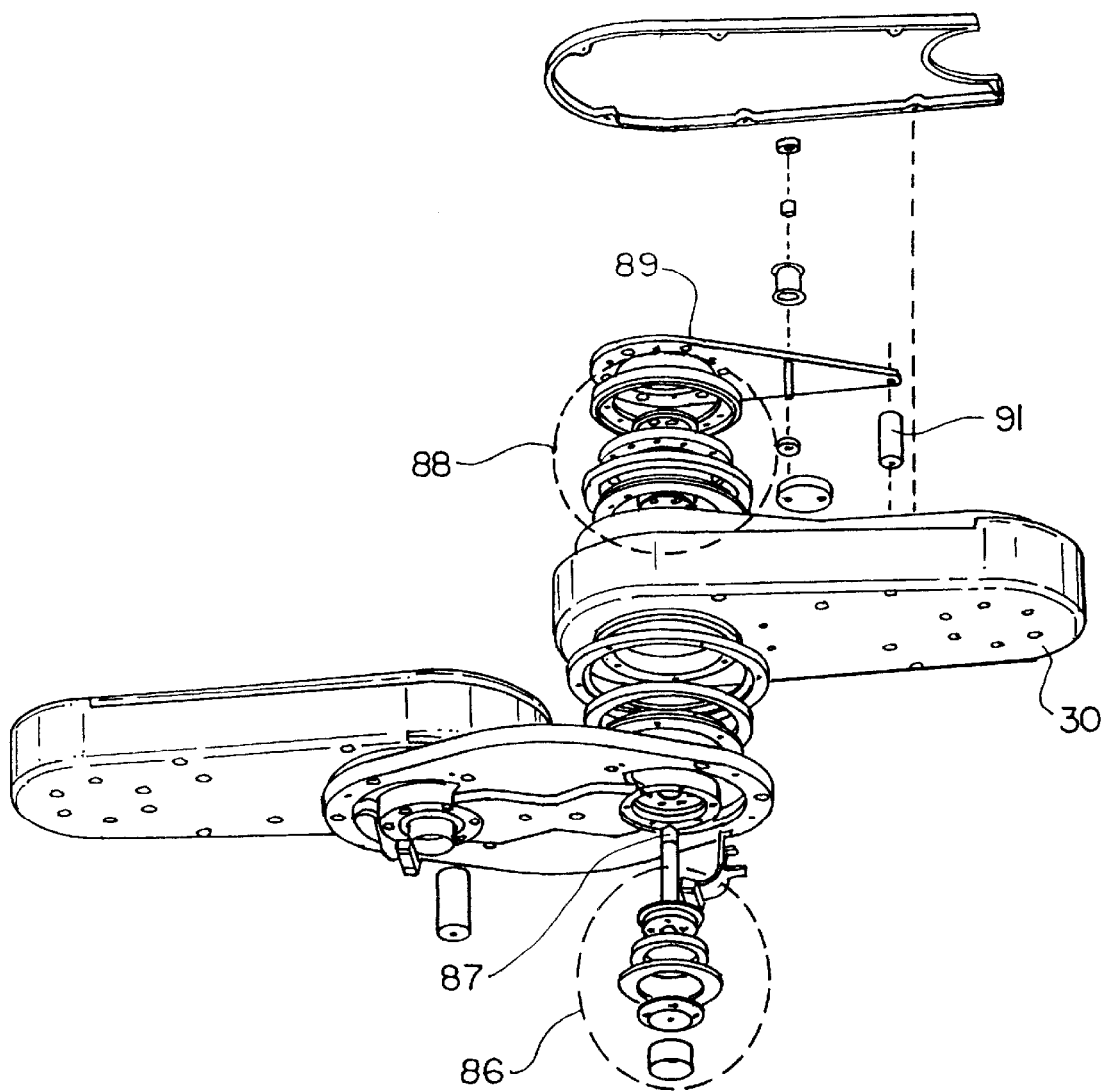

Although the particular internal arm drive mechanism that is used is not critical to the operation of the invention, one particular configuration has been found to be advantageous. FIG. 4B illustrates the use of a harmonic drive mechanism (gear reduction unit) which is instrumental in providing smooth motion and enough torque to move multiple wafers. The gear reduction unit reduces moving parts, provides a strong drive system, avoids the problem of belt wear, and is relatively compact. In addition, it is housed in the arm base for easy accessibility for servicing.

FIG. 4B illustrates that the pulley 86 rotates the shaft 87, which drives the input portion of the harmonic drive 88. The output portion of the harmonic drive 88 is attached to a radial link 89, which in turn is attached to the arm base 30 through spacer 91.

Figure 5:
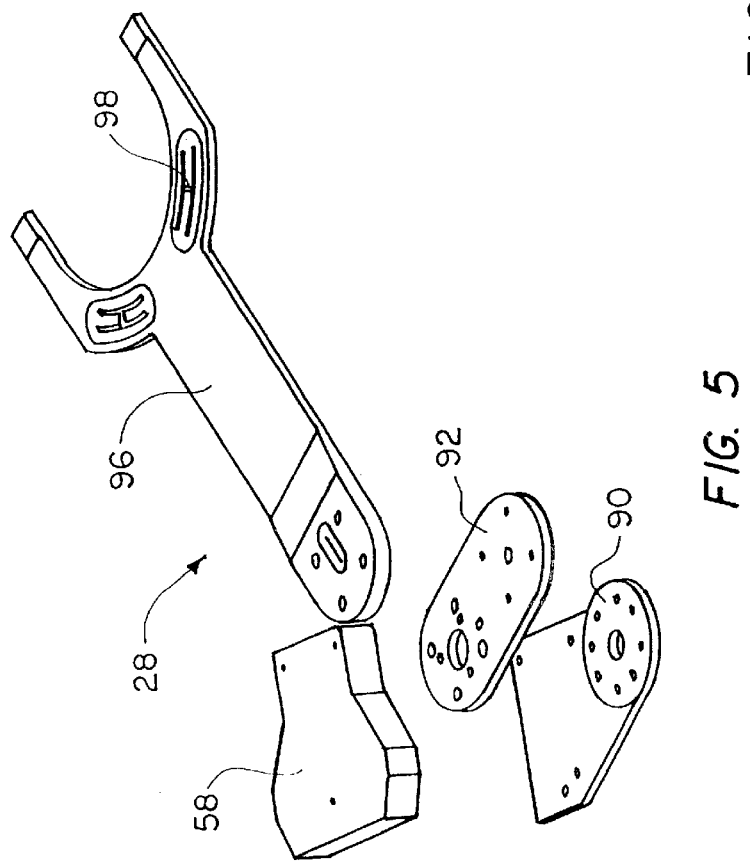
FIG. 5 is an exploded view of a single plane end effector utilized in accordance with the apparatus of FIG. 1.

FIG. 5 is an exploded view of a single plane end effector 28 in accordance with an embodiment of the invention. The device 28 has a connector 90 for attachment to the second arm 26. An intermediate support member 92 is attached to the connector 90. A single plane paddle 96 is attached to the intermediate support member 92. An object sensor 58 is connected to the base of the single plane paddle 96. The object sensor 58 may be an optical sensor, a laser sensor, or the like. The object sensor 58 is used to identify whether substrates are stored at a storage site, such as a cassette. The second arm 26 is manipulated through a variety of positions to allow the object sensor 58 to identify where objects are stored. FIG. 5 also illustrates that the paddle 96 includes a vacuum aperture 98. The vacuum aperture is linked to a vacuum pump (not shown). The vacuum pump establishes suction that secures a substrate to the paddle 96.

Figure 6:
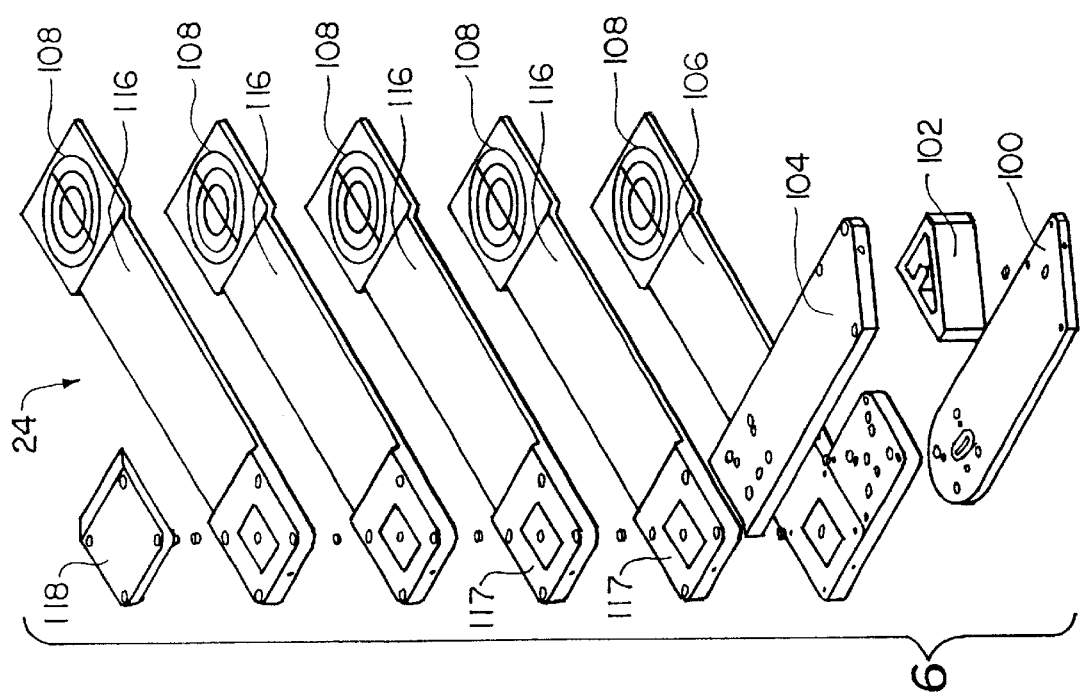
FIG. 6 is an exploded view of a multiple substrate batch loader utilized in accordance with the apparatus of FIG. 1.

FIG. 6 illustrates a multiple substrate batch loader 24 in accordance with an embodiment of the invention. The device 24 includes a first arm connector 100 for connection with the first arm 22. A stand-off 102 is positioned on the first arm connector 100. An elevated base member 104 is positioned on the stand-off 102. A first paddle 106 is positioned and secured between the first arm connector 100 and the elevated base member 104. The first paddle 106 includes a vacuum aperture 108, which operates in the manner described with respect to the vacuum aperture 98 of paddle 96. FIG. 6 illustrates that the multiple substrate batch loader 24 may also include any number of additional paddles 116. Each additional paddle 116 includes a paddle plateau 117, which operates as a stand-off for an adjacent paddle. Each additional paddle 116 also includes a vacuum aperture 108. A paddle cap 118 may be used to secure the vertical arrangement of paddles 116. Each paddle in the multiple substrate batch loader 24 contains an internal vacuum channel. An O-ring is used to seal the vacuum channel between components.

Figure 7:
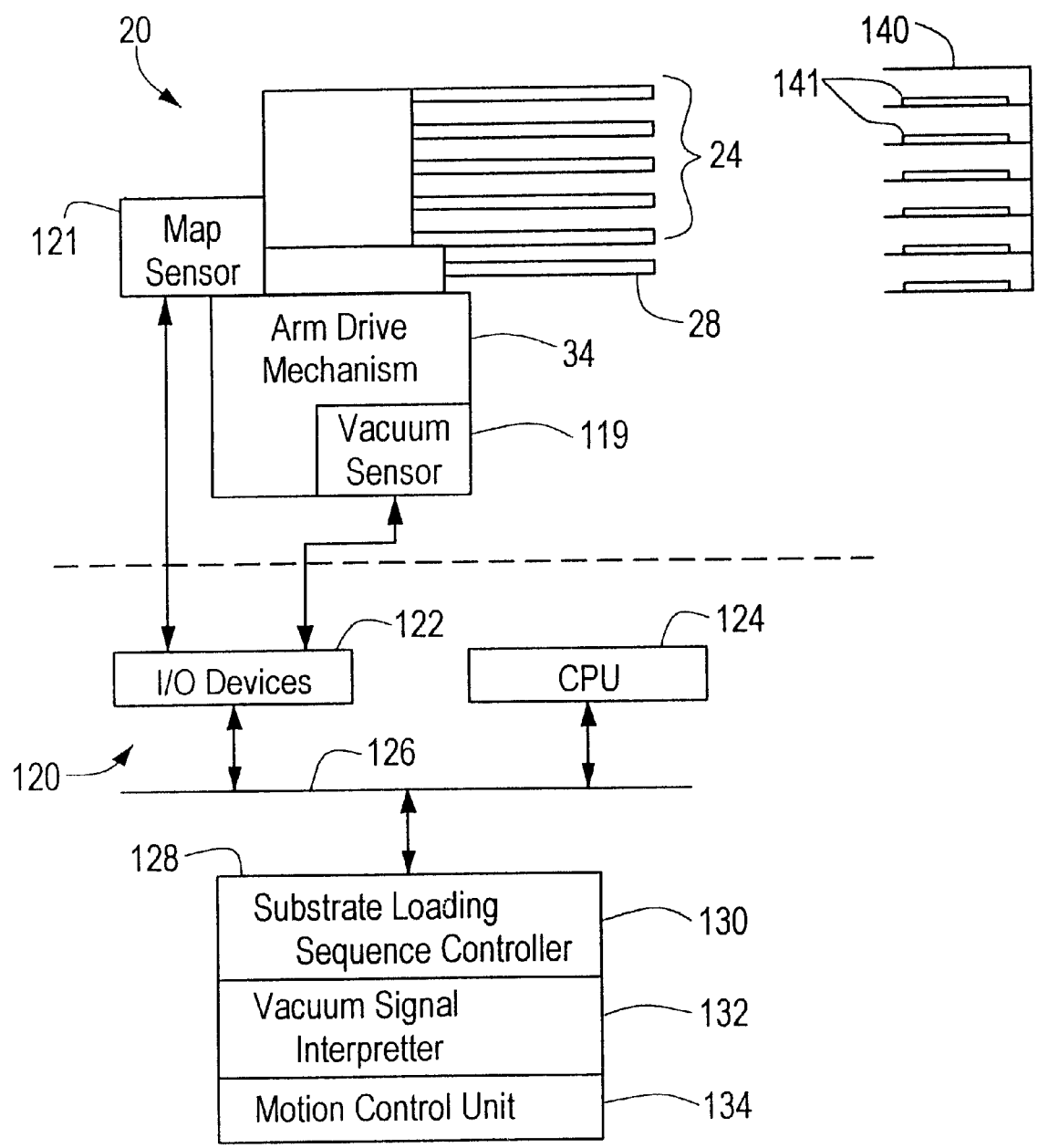
FIG. 7 illustrates the apparatus of FIG. 1 being operated in connection with a control device in the form of a general purpose computer.

FIG. 7 is a simplified illustration of the dual arm batch loading robot 20. The figure illustrates in simplified form the multiple substrate batch loader 24 and the single plane end effector 28. As previously discussed, these components are attached to an arm drive mechanism 34. The arm drive mechanism 34 preferably includes a vacuum sensor 119. The vacuum sensor is used to measure the vacuum signals associated with the various vacuum apertures of the multiple substrate batch loader 24, as further discussed below. FIG. 7 illustrates that the dual arm batch loading robot 20 may operate in connection with a cassette 140, which holds a set of substrates 141.

FIG. 7 also illustrates that the dual arm batch loading robot 20 may be controlled by a control circuit in the form of a general purpose computer 120. The computer 120 includes a set of input/output devices 122 to interface with the robot 20. The input/output devices 122 also include such items as a keyboard, mouse, monitor, printer, and the like. Control signals to and from the robot 20 are exchanged through the input/output devices 122. The control signals include vacuum sensor signals from the vacuum sensor 119 and sensed object signals from the object sensor 58. These signals are passed to the central processing unit (CPU) over bus 126. The bus 126 is also connected to a memory (e.g., RAM, disc memory, or the like) 128, allowing the CPU 124 to execute programs stored within the memory 128. The operation of a computer in connection with input/output devices 122, a CPU 124, and a memory 128 is well known in the art. An aspect of the invention is directed toward the particular types of programs executed by the computer 120.

In accordance with the invention, the memory 128 preferably stores a substrate loading sequence controller program 130, a vacuum signal interpreter program 132, and a motion control unit program 134. The motion control unit program is a standard program for generating control signal for the arm drive mechanism 34. As known in the art, the motion control unit 134 relies upon information from the map sensor 121.

The substrate loading sequence controller 130 is executed by the CPU 124 to select an optimal transport sequence to be performed by the robot 20. The substrate loading sequence controller 130 determines which arm to use when dealing with a partially filled cassette. For example, if the object sensor 58 detects three substrates in the bottom slots of a cassette, a missing substrate above those three, and a group of five substrates above that, the controller 130 can select the single plane end effector 28 to move the first three substrates individually, skip the empty slot, then move the group of five with the multiple substrate batch loader 24. Thus, based upon the information accumulated by the object sensor 58, the controller 130 executes a set of rules to optimize the utilization of the multiple substrate batch loader 24. The execution of these rules typically results in the use of the single plane end effector 28 to move substrates such that groups of substrates are subsequently dispatched with the multiple substrate batch loader 24.

The vacuum signal interpreter 132 as executed by the CPU 124 processes the control signal from the vacuum sensor 119. The vacuum sensor 119 is tied to each of the vacuum apertures of the individual paddles of the batch loader 24. Since the batch loader 24 has all of its blades tied into a single vacuum source, there is only one vacuum sensor which is used to detect the presence of the substrates. If only four out of five wafers are present, a "vacuum leak" on the blade without a wafer is reflected in an altered vacuum signal. The vacuum leak results in reduced suction at the remaining substrates. In response to this condition, the vacuum signal interpreter reduces the speed of the arm 22 to insure safe transport of the substrates. Observe that the object sensor 58 will typically provide information as to how many substrates will be carried at any given time. However, the vacuum signal interpreter 132 operates as a redundant failsafe mechanism, or alternatively, as a substitute mechanism if an object sensor 58 is not available. The vacuum signal interpreter 132 may be implemented as simple circuit that determines whether any paddle is not carrying a substrate. In response to such a condition, the altered movement of the robotic arm can be adjusted. In other words, in this embodiment the vacuum signal is not mapped to a specific number of substrates that are missing in the batch loader. Instead, if only a single substrate is missing the motion of the arm is adjusted.

Those skilled in the art will appreciate that the invention provides an improved technique for robotic-based bulk transfers of substrates. The bulk transfer technique of the invention allows for the transfer of various numerical combinations of substrates to optimize transfer operations. The vacuum-sensor associated with the multiple substrate batch loader facilitates a low cost assessment of the number of substrates being transferred at any given time. Based upon this information, the motion of the robot may be altered. Advantageously, the invention utilizes known materials and techniques and is otherwise compatible with existing robotic processes.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A dual-armed robot for handling substrates disposed in a container providing a plurality of uniformly-spaced storage slots arranged vertically, the robot comprising;
    a multiple plane substrate holder, comprising a plurality of identical modular paddles stacked on a base paddle with uniform spacing between the paddles, for transporting multiple substrates to and from respective ones of the storage slots;
    a first arm supporting the base paddle of the multiple plane substrate holder;
    a single plane substrate holder for transporting a single substrate;
    a second arm disposed beneath the first arm and supporting the single plane substrate holder, the first and the second arms arranged so that the single plane substrate holder is alignable with and beneath the base paddle of the multiple plane substrate holder;
    an arm drive mechanism, connected to the first and second arms to operate the first and second arms, the first and second arms non-interfering and operable independently from each other in either a cooperative or a distinct manner;
    a controller to control arm operation, wherein the multiple plane and single plane substrate holders may be operated in configurations chosen from the group of only the multiple substrate batch holder, only the single plane substrate holder and both the multiple substrate batch holder and the single plane substrate holder.

2. The robot of claim 1 wherein each paddle of the multiple plane substrate holder and the single plane substrate holder includes a vacuum aperture connected to a vacuum source.

3. The robot of claim 2 further comprising a vacuum sensor to receive a vacuum signal from the vacuum apertures of the multiple plane substrate holder.

4. The robot of claim 3 further comprising a vacuum signal interpreter connected to the vacuum sensor to determine a substrate load number indicative of how many substrates are held by the multiple plane substrate holder.

5. The robot of claim 4 wherein the vacuum signal interpreter alters the speed of movement of the first arm in response to the substrate load number.

6. The robot of claim 1 further comprising an object sensor connected to the second arm.

7. The robot of claim 6 wherein the object sensor detects the presence of a substrate in a slot in the container.

8. The robot of claim 7 further comprising a substrate loading sequence controller to control the first arm and the second arm in response to a pattern of substrates in the container, as determined from the data from the object sensor, such that the first and second arms remove substrates from the container in a predetermined sequence, dependent on the number and position of the substrates.

9. The robot of claim 1 wherein the arm drive mechanism operative to controllably move the first arm is a harmonic drive mechanism.

* * * * *